(12) United States Patent
Haba et al.

(10) Patent No.: US 7,632,708 B2
(45) Date of Patent: Dec. 15, 2009

(54) MICROELECTRONIC COMPONENT WITH PHOTO-IMAGEABLE SUBSTRATE

(75) Inventors: Belgacem Haba, Saratoga, CA (US); David B. Tuckerman, Orinda, CA (US)

(73) Assignee: Tessera, Inc., San Jose, CA (US)

( * ) Notice: Subject to any disclaimer, the term of this patent is extended or adjusted under 35 U.S.C. 154(b) by 112 days.

(21) Appl. No.: 11/318,822

(22) Filed: Dec. 27, 2005

(65) Prior Publication Data
US 2007/0148941 A1    Jun. 28, 2007

(51) Int. Cl.
*H01L 21/00*    (2006.01)
(52) U.S. Cl. ............................ 438/106; 438/14; 438/17; 438/107; 438/118; 438/123; 257/E21.503; 257/E21.508; 257/E21.511; 257/E23.004; 257/E23.021; 257/E23.067; 257/E23.068; 257/E23.124; 257/E23.062; 257/E25.013
(58) Field of Classification Search ................ 438/598, 438/597, 618, 14, 18, 106–127, 612; 257/E29.031, 257/E23.001, E21.503, 508, 511, E23.004, 257/21, 62, 67, 68, 124, E25.003
See application file for complete search history.

(56) References Cited

U.S. PATENT DOCUMENTS

| | | | |
|---|---|---|---|
| 5,219,787 A * | 6/1993 | Carey et al. ............... 438/637 |
| 6,029,344 A * | 2/2000 | Khandros et al. ........... 29/874 |
| 6,350,632 B1 * | 2/2002 | Lin ........................... 438/107 |
| 6,372,620 B1 | 4/2002 | Oosawa et al. |
| 6,417,029 B1 * | 7/2002 | Fjelstad .................... 438/126 |
| 6,528,874 B1 | 3/2003 | Iijima et al. |
| 6,551,849 B1 * | 4/2003 | Kenney ..................... 438/34 |
| 6,586,826 B1 * | 7/2003 | Glenn et al. ................ 257/686 |
| 6,589,819 B2 * | 7/2003 | Smith et al. ................ 438/123 |
| 6,782,610 B1 | 8/2004 | Iijima et al. |
| 6,884,709 B2 | 4/2005 | Iijima et al. |
| 7,071,520 B2 * | 7/2006 | Reid .......................... 257/414 |
| 7,112,520 B2 * | 9/2006 | Lee et al. ................... 438/612 |
| 7,176,043 B2 * | 2/2007 | Haba et al. ................. 438/14 |
| 7,317,249 B2 * | 1/2008 | Crisp et al. ................. 257/723 |
| 2002/0155661 A1 * | 10/2002 | Massingill et al. ......... 438/244 |
| 2004/0201096 A1 | 10/2004 | Iijima et al. |
| 2005/0097727 A1 | 5/2005 | Iijima et al. |
| 2005/0116326 A1 | 6/2005 | Haba et al. |
| 2005/0173805 A1 | 8/2005 | Damberg et al. |
| 2005/0181544 A1 | 8/2005 | Haba et al. |
| 2005/0181655 A1 | 8/2005 | Haba et al. |
| 2006/0073701 A1 * | 4/2006 | Koizumi et al. ............ 438/666 |
| 2007/0047377 A1 * | 3/2007 | Bang et al. ................. 365/233 |
| 2008/0054462 A1 * | 3/2008 | Kim et al. .................. 257/738 |
| 2008/0316723 A1 * | 12/2008 | Borland et al. ............. 361/763 |

\* cited by examiner

*Primary Examiner*—Michael S Lebentritt
(74) *Attorney, Agent, or Firm*—Lerner, David, Littenberg, Krumholz & Mentlik, LLP

(57) ABSTRACT

Methods for making a microelectronic component including a plurality of conductive posts extending and projecting away from a flexible substrate, wherein at least some of the conductive posts are electrically connected to a plurality of traces exposed on the flexible substrate.

23 Claims, 9 Drawing Sheets

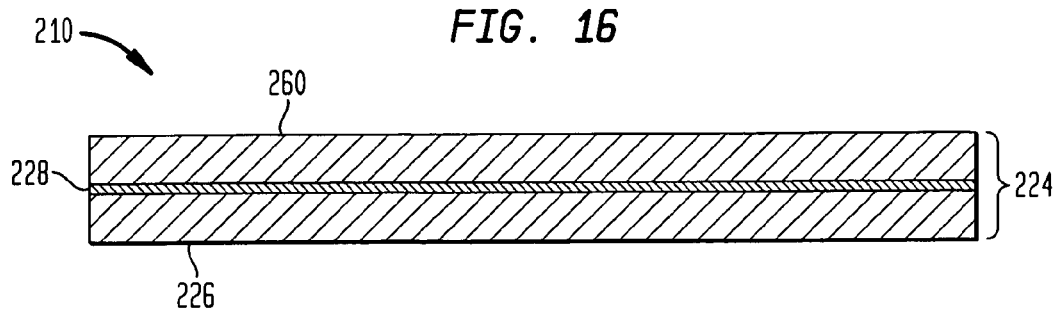
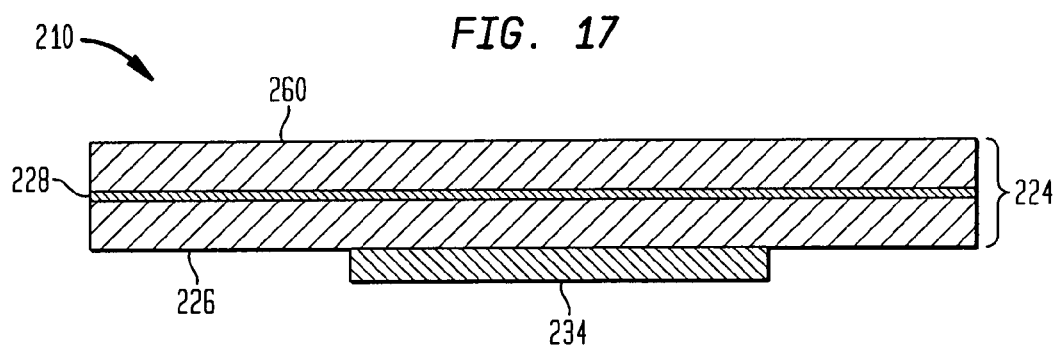
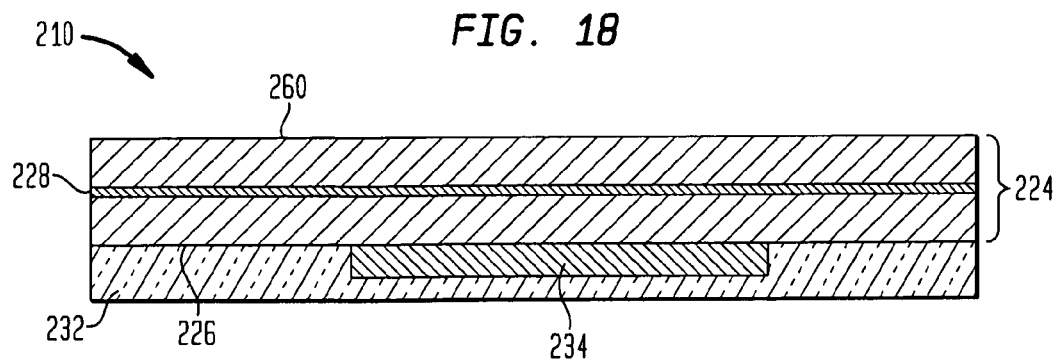

MICROELECTRONIC COMPONENT WITH PHOTO-IMAGEABLE SUBSTRATE

BACKGROUND OF THE INVENTION

The present invention relates to methods for making microelectric components for microelectronic packages.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Certain types of packages have been developed which utilize a microelectronic component having a flexible dielectric substrate having conductive traces disposed thereon. In such an arrangement, electrically conductive posts or pillars project from a surface of the flexible substrate. Each post is connected to a portion of one of the traces. This type of microelectric component is particularly useful in chip packages having arrangements that allow each post to move independently of the other posts. The movement of the posts allows the tips of the plural post to simultaneously engage contact pads on a circuit board despite irregularities in the circuit board or the package, such as warpage of the circuit board. Additionally, this facilitates testing of the package using simple test boards which may have substantially planar contacts, and avoids the need for specialized, expensive test sockets.

This type of microelectronic component has various applications and can be used in a number of different microelectronic package arrangements. As disclosed in certain preferred embodiments of U.S. patent application Ser. Nos. 11/014,439; 10/985,119; and 10/985,126, the disclosures of which are incorporated by reference herein, one such microelectronic package can include a microelectronic element such as a semiconductor chip and a microelectronic component comprising a flexible substrate spaced from and overlying a first face of the microelectronic element. Such a component can include a plurality of conductive posts extending from the flexible substrate and projecting away from the microelectronic element, at least some of the conductive posts being electrically interconnected with said microelectronic element. Additionally, such a package can include a plurality of support elements disposed between the microelectronic element and the substrate and supporting the flexible substrate over the microelectronic element. Desirably, at least some of the conductive posts are offset in horizontal directions parallel to the plane of the flexible substrate from the support elements. For example, the support elements may be disposed in an array with zones of the flexible substrate disposed between adjacent support elements, and the posts may be disposed near the centers of such zones.

The offset between the posts and the support elements allows the posts, and particularly the bases of the posts adjacent the substrate, to move relative to the microelectronic element. This arrangement can allow each post to move independently of the other posts.

The flexible substrate can overlie the front or contact-bearing face of the microelectronic element. In this arrangement at least some of the support elements desirably are electrically conductive elements such as solder balls. The conductive support elements may electrically interconnect at least some of the contacts of the microelectronic element with at least some of the conductive posts. In preferred forms, this arrangement can prove low-impedance conductive paths between the posts and the microelectronic element, suitable for high-frequency signal transmission. At least some of the posts can be connected to at least some of the contacts on the microelectronic element by conductive support elements immediately adjacent to those posts. It is advantageous that conductive traces provided on the flexible substrate electrically interconnect at least some of the conductive posts with at least some of the conductive support elements. These traces may be very short; the length of each trace desirably being equal to the offset distance between a single post and a single support element.

The flexible dielectric substrate utilized in such a microelectronic component can be made from a material such as a polyimide or other polymeric sheet. It includes a top surface and a bottom surface remote therefrom. Although the thickness of the dielectric substrate will vary with the application, the dielectric substrate most typically is about 10 µm-100 µm thick. The flexible sheet has conductive traces thereon. In one embodiment the conductive traces are disposed on the bottom surface of the flexible sheet. However, in other embodiments, the conductive traces may extend on the top surface of the flexible sheet; on both the top and bottom faces or within the interior of flexible substrate. Conductive traces may be formed from any electrically conductive material, but most typically are formed from copper, copper alloys, gold or combinations of these materials. The thickness of the traces will also vary with the application, but typically is about 5 µm-25 µm. Traces are arranged so that each trace has a support end and a post end remote from the support end. The dielectric sheet, traces and posts can be fabricated by a process such as that disclosed in co-pending, commonly assigned U.S. patent application Ser. No. 10/959,465, the disclosure of which is incorporated by reference herein. As disclosed in greater detail in the '465 application, a metallic plate is etched or otherwise treated to form numerous metallic posts projecting from the plate. A dielectric layer is applied to this plate so that the posts project through the dielectric layer. An inner side of the dielectric layer faces toward the metallic plate, whereas the outer side of the dielectric layer faces towards the tips of the posts. Previously this dielectric layer has been fabricated by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

Despite these advances in the art, still further improvements in making microelectronic components would be desirable.

SUMMARY OF THE INVENTION

One aspect of this invention provides a method of forming a microelectronic connection component, which includes treating an in-process unit having a first dielectric layer, traces exposed at a surface of the first dielectric layer, and a first metal layer overlying the traces and dielectric layer by etching the first metal layer to form posts projecting from the traces.

Another aspect of this invention provides a method of forming a microelectronic connection component including providing an in-process unit having a first metal layer having first and second surfaces and posts projecting from the first surface of the first metal layer. A first dielectric layer is then deposited on the posts and the first surface of the first metal layer. A portion of the first dielectric layer is then removed such that substantially all of the first dielectric layer is removed from the posts and at least some of the first dielectric layer remains exposed on the first surface. The in-process unit is then treated to form traces such that the posts project from the traces.

BRIEF DESCRIPTION OF THE DRAWINGS

FIGS. 16-20 are diagrammatic sectional views depicting components during successive steps in a method of making a microelectronic component in accordance with another embodiment of the present invention.

DETAILED DESCRIPTION

Figure 2:
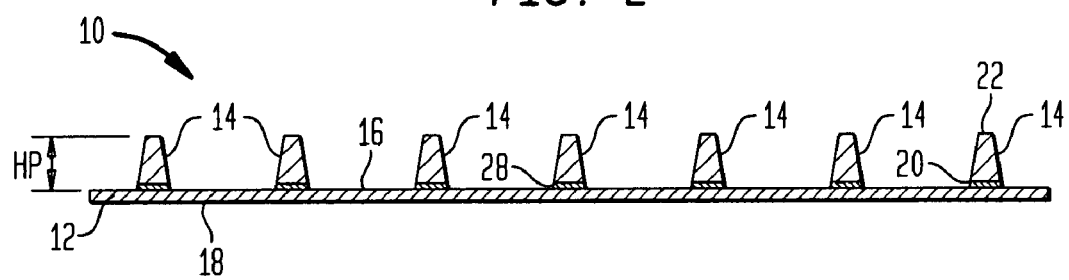

A method according to one embodiment of the invention uses a portion of an in-process unit 10 (FIG. 2). The in-process unit 10 includes a first metal layer 12 with an inside surface 16 facing upwardly and an outside surface 18 facing downwardly. As used in this disclosure, terms such as "upwardly," "downwardly," "vertically," and "horizontally" should be understood as referring to the frame of reference of the element specified and need not conform to the normal gravitation frame of reference. A series of posts 14 project vertically from the inside surface 16 of the first metal layer 12. The dimensions of the posts can vary over a significant range, but most typically the height HP of each post above the inside surface of the first metal layer 12 is about 50-33 µm. Each post has a base 20 adjacent the first metal layer 12 and a tip 22 remote from the first metal layer 12. In the particular embodiment illustrated, the posts 14 are generally frustroconical in shape, so that the base 20 and the tip 22 of each post are substantially circular. The bases 20 of the posts 14 typically are about 100-600 µm in diameter, whereas the tips 22 typically are about 40-200 micrometers in diameter. Preferably, the posts 14 are formed from a conductive metal such as copper.

Figure 1:
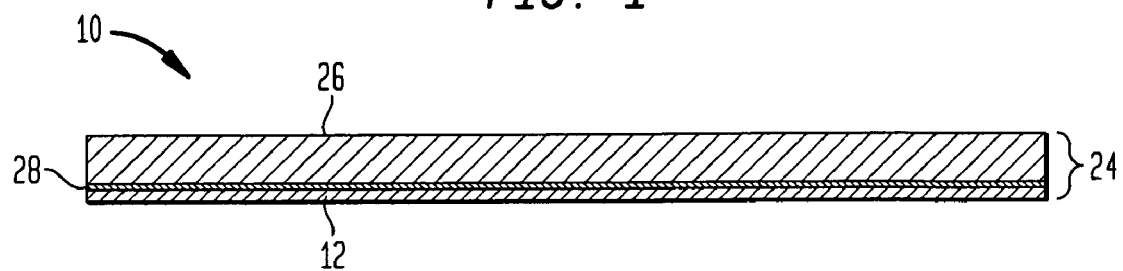
FIGS. 1-6 are diagrammatic sectional views depicting components during successive steps in a method of making a microelectronic component in accordance with one embodiment of the present invention.

The in-process unit may be formed from a tri-metal substrate 24 (FIG. 1). The tri-metal substrate 30 has a first metal layer 12, a second metal layer 26, and an etch-stop layer 28 disposed between the first and second metal layers 12, 26. The posts 14 (FIG. 2) are formed by etching the second metal layer 26. After etching the second metal layer 26 to form posts 14, the etch-stop layer 28 will remain disposed on the first metal layer 12. Preferably, the portions of the etch-stop layer 28 that are located between the posts 14 are removed from the first metal layer 12. This can be done by means including chemical treatment. Desirably, first and second metal layers 12 and 26 are formed from conductive, readily etchable metals such as copper or copper alloys. The etch-stop layer 28 is preferably made from nickel or another suitable substance having etching properties different than those of the first and second metal layers.

Figure 3:
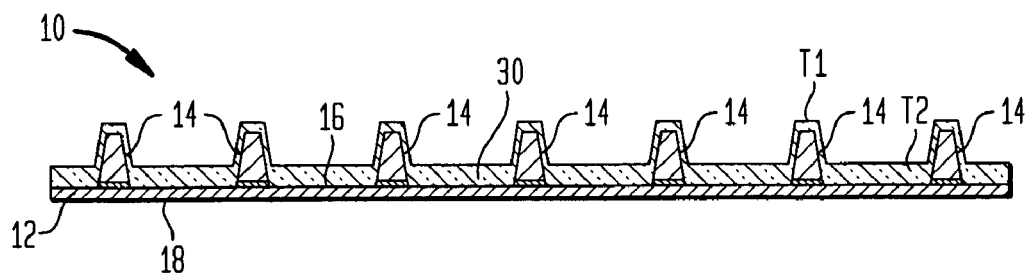

In one step of the method according to this embodiment of the invention, a first dielectric layer 30 (FIG. 3) is deposited on the in-process unit 10, including the inside surface 16 of the first metal layer 12 and the posts 14. The first dielectric layer 30 can be made of materials such as polyimide, solder mask, or other polymeric material.

The first dielectric layer 30 is applied to the in-process unit 10 such that its thickness T1 where applied to the inside surface 16 of the first metal layer 12 is greater than its thickness T2 where it is applied to the posts 14. The geometry of the in-process unit 10 inherently leads to this difference in thickness when depositing the dielectric layer on the inside surface 16 and the posts 14. For example, a dielectric layer 30 may be applied by draping a pre-existing layer of a dielectric in a soft, pliable condition over the posts, and forcing the layer into conformity with the posts and with the region between the posts. For example, a fluid such as air under pressure may be applied to the surface of the dielectric layer facing away from the in-process unit. The portions of the layer aligned with the posts are stretched and thinned during this process. In some cases, the minimum thickness will occur along the sides of the posts. In another variant, the dielectric layer is formed by applying a dielectric in liquid form and curing the dielectric. This also tends to form a dielectric layer which has thin portions on the posts.

Figure 4:
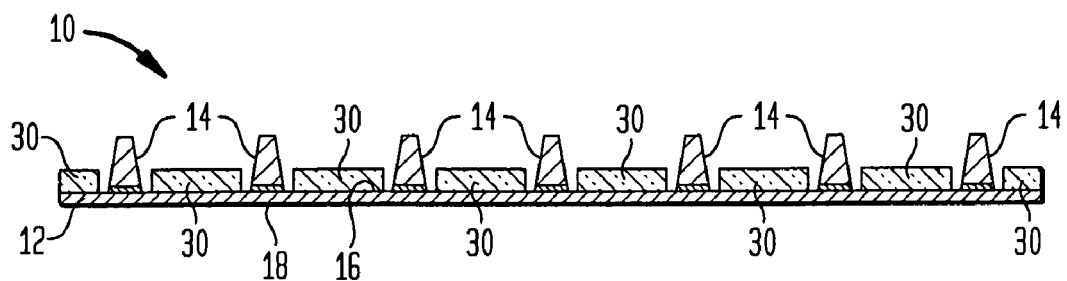

The first dielectric layer 30 is then subjected to a process by which substantially all of the dielectric layer is removed from the posts 14, while a sufficient amount of the first dielectric layer 30 remains fixed on the inside surface 16 of the first metal layer 12. Such a process can include etching using a plasma, washing with a solvent which attacks the dielectric or other processes. Preferably, the process of removing the first dielectric layer 30 from the posts 14 includes a non-selective process. A non-selective process inherently includes removing a portion of the first dielectric layer 30 from the inside surface 16. As used in this disclosure with reference to a process applied to a layer or surface, a "non-selective process" is one that is applied indiscriminately to all portions of the layer or surface. Where a non-selective process is applied to a layer of uniform composition and uniform physical state, such a process typically removes substantially the same amount of the dielectric layer 10 per unit time from both the inside surface 16 and the posts 14. Because the thickness T1 of the first dielectric layer 30 deposited on the inside surface 16 is greater than that which is deposited on the posts 14, the entire portion of the first dielectric layer 30 deposited on the posts 14 can be removed, while leaving an appropriate amount of the first dielectric layer 30 on the inside surface 16 (FIG. 4).

Alternatively or additionally, the process of removing the first dielectric layer 30 from the posts may include a selective process. A "selective process" is one that is only carried out on specific portions of the first dielectric layer 30. For example, those portions of the dielectric on inside surface 16 may be masked prior to etching, so that the etching is applied only to those portions of the first dielectric layer 30 that are disposed on the posts 14.

More preferably, the first dielectric layer 30 is made of a photo-imageable material such as a photo-imageable polyimide. In one embodiment, such a photo-imageable material may be of the type that is cured by selective exposure to light. This allows the first dielectric layer 30 to be deposited on the inside surface 16 of the first metal layer 12 and the posts 14 in an uncured state. An "uncured state" is one in which the dielectric material is either liquid or is otherwise unfixed on the surface to which it is applied. The first dielectric layer 30 is then selectively exposed to light in the areas where the first dielectric layer 30 is deposited on the inside surface 16 of the first metal layer 12, but not in areas where the first dielectric layer 30 is disposed on the posts 14. Thus, the material on the inside surface 16 is cured to a greater extent than the material on the posts 14. The in-process unit 10 is then subjected to a non-selective process, such as washing, by which the uncured portion of the dielectric layer can be removed while leaving the cured portion of the first dielectric layer 30 fixed on the inside surface 16.

Although the thickness of the first dielectric layer 30 will vary with the application, the first dielectric layer after removal of the material on the posts, most typically is about 10 μm to 100 μm thick in the regions between posts.

Figure 5:
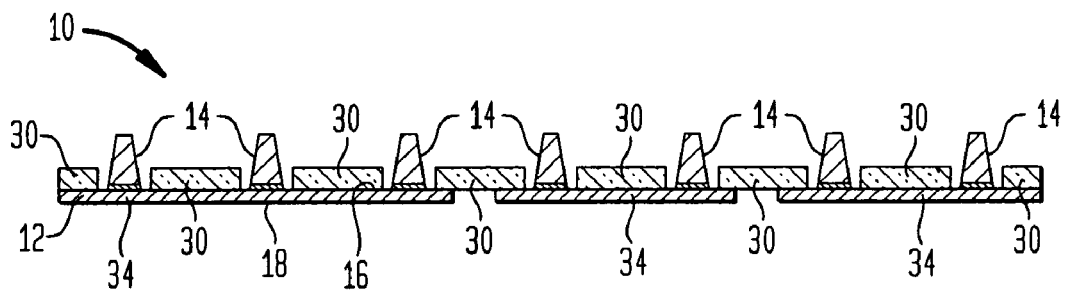
Figure 21:
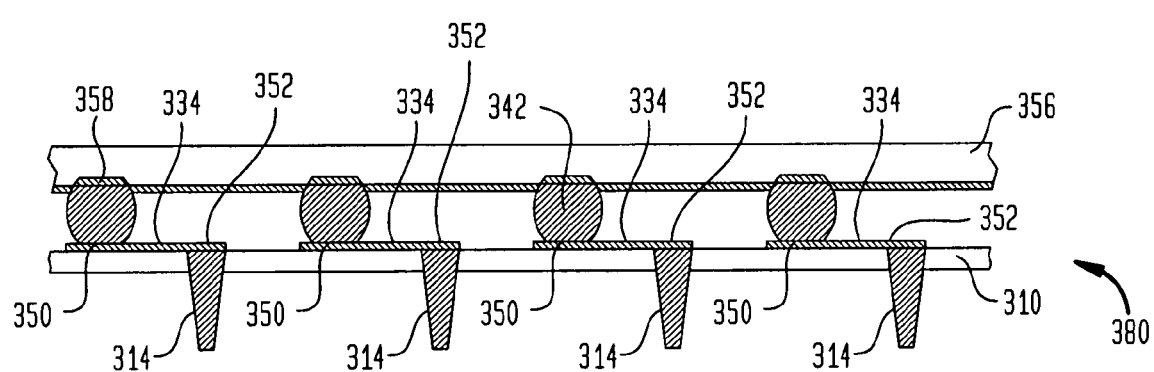
FIG. 21 is a diagrammatic sectional view of a microelectronic package according to one embodiment of the invention.

The in-process unit 10 is then treated to form traces 34 (FIG. 5) from the metal layer 12 (FIG. 4). The traces 34 may be formed from the first metal layer 12 by means including etching. The thickness of the traces 34 will vary with the application, but typically is about 5 μm to 25 μm. The traces are formed such that the posts 14 project away from the traces 34 in the vertical direction. The traces can form electronic circuitry according to methods known in the art. When the traces 34 are formed, portions of the first metal layer 12 are removed, thereby separating the first metal layer into numerous separate traces and creating an exposed face 36 of the first dielectric layer 30 in regions between the traces. The first dielectric layer 30 holds the separate traces in position. The particular arrangement of traces may be dictated by circuit requirements. For example, in the embodiment of FIG. 5, at least one trace interconnects two or more posts with one another, but this is not essential. In other embodiments, the traces 34 and posts 14 are arranged in the manner disclosed in commonly-assigned, co-pending U.S. patent application Ser. No. 11/014,439, the disclosure of which is incorporated herein by reference. In this embodiment, traces are arranged such that each trace has a support end and a post end remote from the support end as shown in FIG. 21, and as further discussed below.

Optionally, a second dielectric layer 32 may be deposited on the in-process unit 10, on the side opposite from the posts, so that the second dielectric layer overlies traces 34 and a face of the first dielectric layer. The second dielectric layer may be formed so that portions of the traces 34 are exposed at the second dielectric layer 32. As used in the present disclosure, a conductive feature such as a trace is referred to as "exposed at" a surface when such feature is accessible for engagement by a theoretical point moving toward the surface in a direction perpendicular to the surface. Thus, the traces 34 may be flush with the second dielectric layer 32, may be recessed relative to the second dielectric layer 32 as depicted, or may project from therefrom. The second dielectric layer 32 preferably includes openings or vias 40 formed therein such that access is provided to a portion of each trace 34. The resulting connection component can be used as part of a microelectronic assembly, for example, in an assembly as discussed further below; and as discussed in the aforesaid patent application incorporated by reference. Electrical connections can be made to the exposed portions of the traces.

Figure 9:
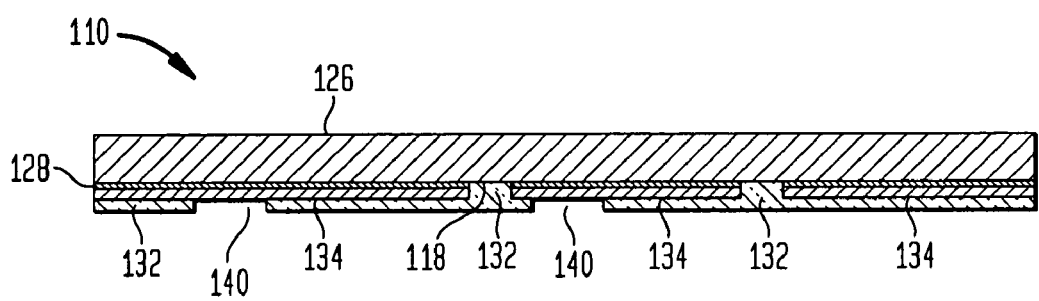

A process according to a second embodiment of the invention uses an in-process unit 110 (FIG. 9) having a first dielectric layer 132, traces 134 exposed on the first dielectric layer 132, and a first metal layer 126 overlying the traces 134 and the first dielectric layer 132. The traces 134 may be flush with the first dielectric layer 132, may be recessed relative to the first dielectric layer 132 as depicted, or may project therefrom. The traces 134 are formed from any electrically conductive material, but most typically are formed from copper, copper alloys, gold or combinations of these materials. Here again, the thickness of the traces 134 will vary with the application, but typically is about 5 μm to 25 μm. Preferably, the in-process unit 110 includes a number of traces 134 forming electronic circuitry according to methods known in the art.

Figure 6:
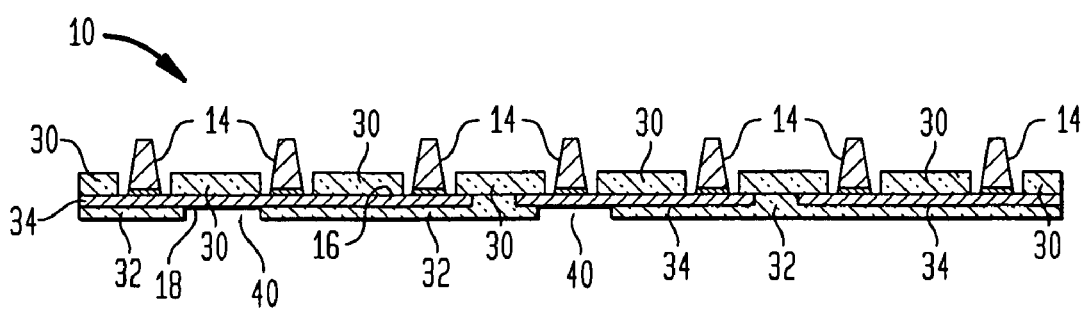
Figure 7:
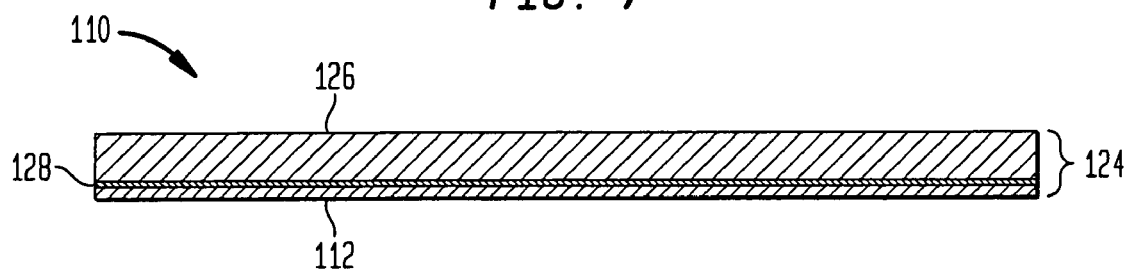
FIGS. 7-11 are diagrammatic sectional views depicting components during successive steps in a method of making a microelectronic component in accordance with another embodiment of the present invention.
Figure 8:
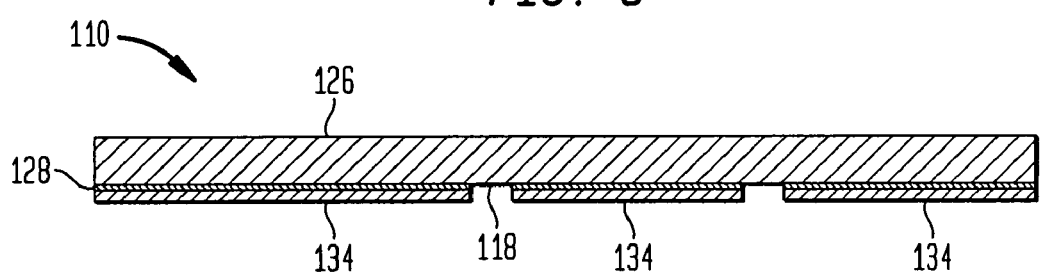

In-process unit 110 may be formed using a tri-metal layer 124 (FIG. 7) having a first metal layer 126, a second metal layer 112, and an etch-stop layer 128 formed therebetween. The traces 134 are formed in the in-process unit 110 by etching the second metal layer 112. Formation of the traces 134 causes certain areas of the etch-stop layer 128 to become exposed. These exposed portions of the etch-stop layer are then removed, as for example, by a further etching process. The first dielectric layer 132 is then deposited over the traces and the exposed surface 136 of the first metal layer 126. The first dielectric layer 132 may be formed from any known dielectric material such as polyimide in the same way as the second dielectric layer 32 (FIG. 6) discussed above. Vias 140 can be formed in the first dielectric layer 132 so that portions of at least some traces 134 are exposed at the surface of the dielectric layer facing away from first metal layer 126. Preferably, the first dielectric layer 132 is made from a photo-imageable material, which will facilitate formation of the vias 140.

Figure 10:
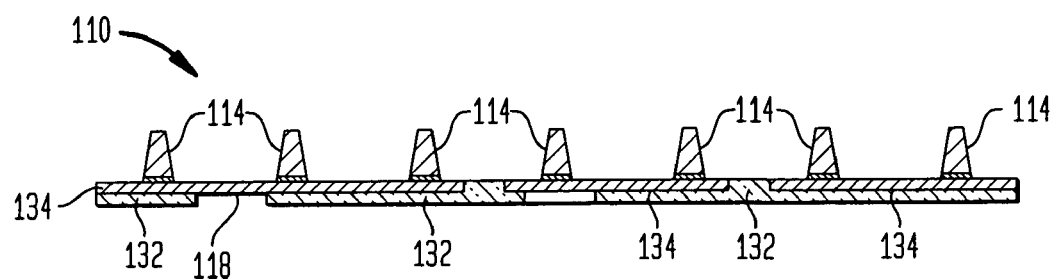
Figure 11:
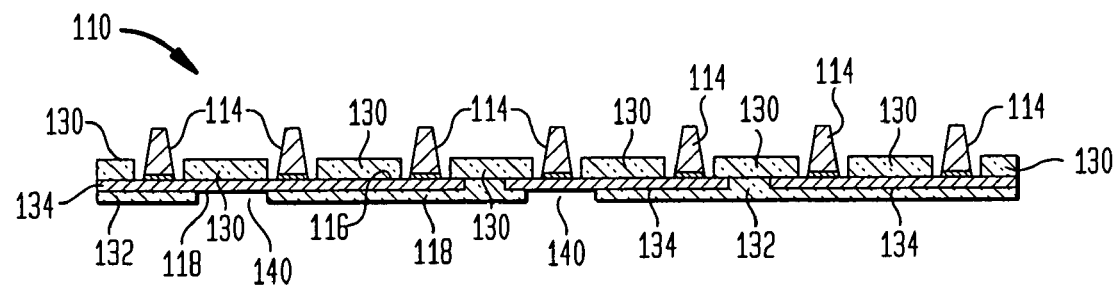
Figure 12:
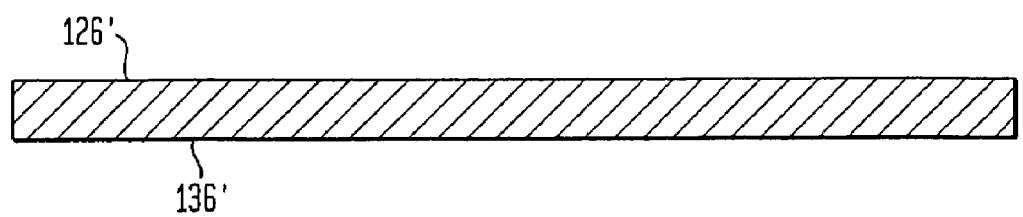
FIGS. 12-15 are diagrammatic sectional views depicting components during successive steps in a method of making a microelectronic component in accordance with another embodiment of the present invention.

The first metal layer 126 is then treated to form posts 114 (FIG. 10) that project vertically away from the traces 134. As previously discussed, the posts 114 can be formed by any means including etching. Such treatment of the first metal layer 126 will expose an inside surface 116 of the in-process unit 110, which will include portions of both the traces 134 and the first dielectric layer 132. The dimensions of the posts 114 may be as discussed above with reference to FIG. 2.

Here again, the posts 114 project away from the traces 134. Here again, the traces 134 and posts 114 may be arranged in any desired pattern including that disclosed in commonly-assigned, co-pending U.S. patent application Ser. No. 11/014, 439, the disclosure of which is incorporated herein by reference, and as discussed below with reference to FIG. 21.

Optionally, after the posts 114 are formed, a second dielectric layer 130 is deposited on the inside surface 116 of the in-process unit 110. The second dielectric layer 116 can be formed by means known in the art, including forceably engaging the posts 114 with a dielectric sheet so that the posts 114 penetrate through the sheet. More preferably, the dielectric layer is fabricated by depositing a dielectric onto the in-process unit 110. Preferably, this is done by applying the dielectric layer to the inside surface 116 and the posts 114. The second dielectric layer 130 is then completely removed from the posts 114, while leaving an appropriate amount of the second dielectric layer 130 on the inside surface 116. The processes discussed above with reference to FIGS. 3 and 4 for applying and removing of a dielectric layer overlying posts may be employed.

Figure 13:
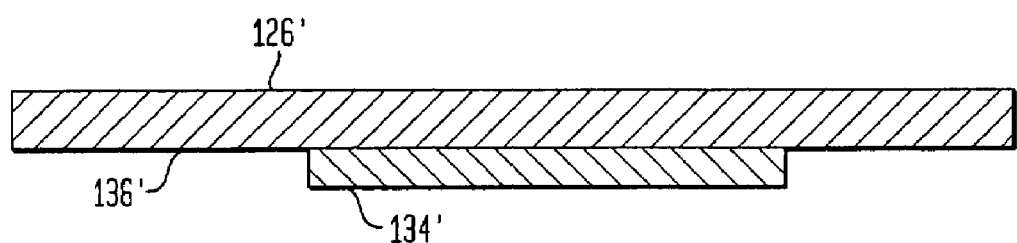
Figure 14:
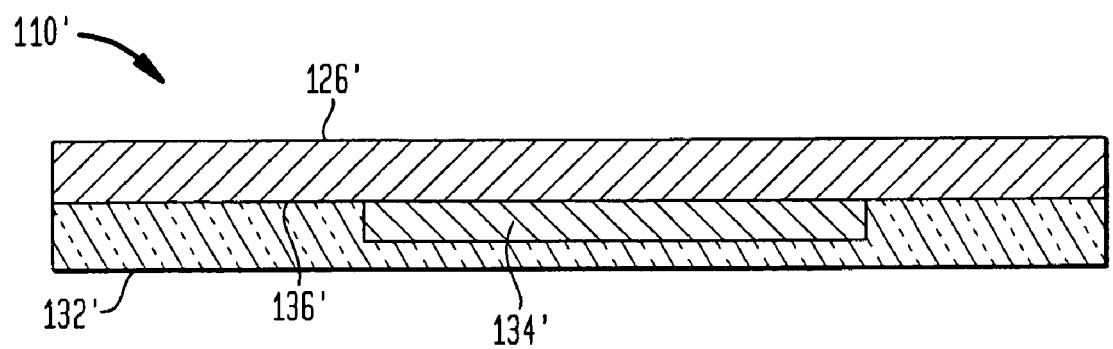
Figure 15:
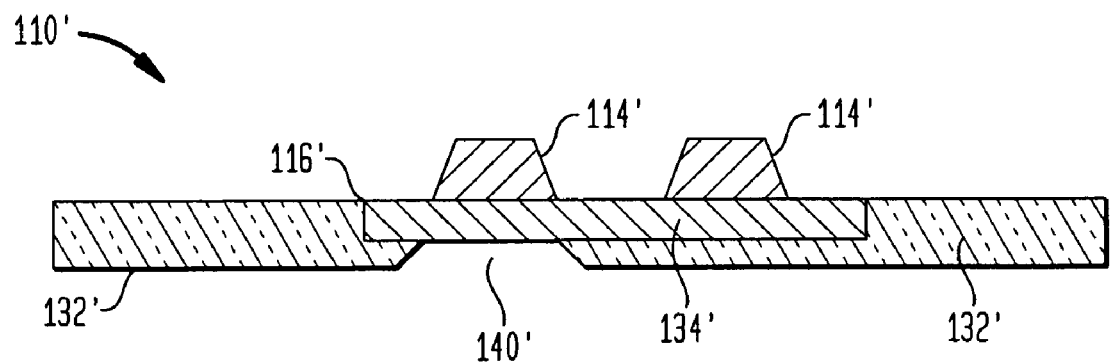
Figure 19:
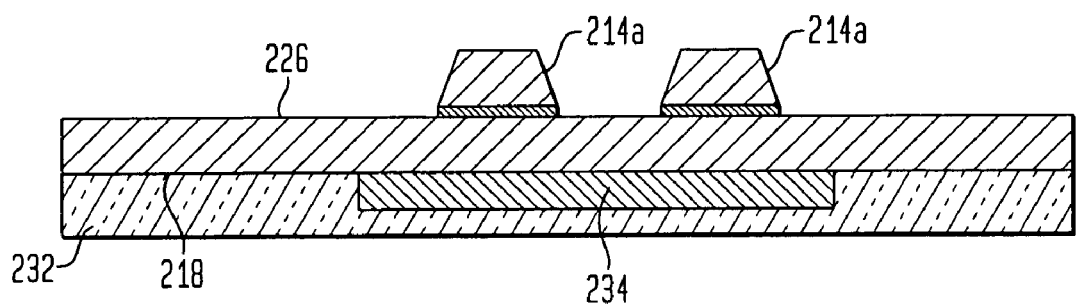

In a variation of the process of FIGS. 7-11, the in-process unit 110' (FIG. 14) may be formed by selectively plating traces 134' (FIG. 13) onto an outside surface 136' of a first metal layer 126'. The first dielectric layer 132' (FIG. 14) is then deposited over the traces 134' and the outside surface 136' of the first metal layer 126', according to processes previously discussed, such that the traces 134' are exposed at the first dielectric layer 132'. After depositing of the first dielectric, the posts 114' are formed by etching the first metal layer 126'. To assure that the traces remain intact when the first metal layer is etched, the traces may be formed entirely or partially from a metal resistant to the etchant. For example, the traces may be formed entirely from gold, or may include a layer of nickel or gold confronting the outside surface 136' of the first metal layer 126'. Preferably, the traces 134' are embedded in the first dielectric layer 132'.

Figure 20:
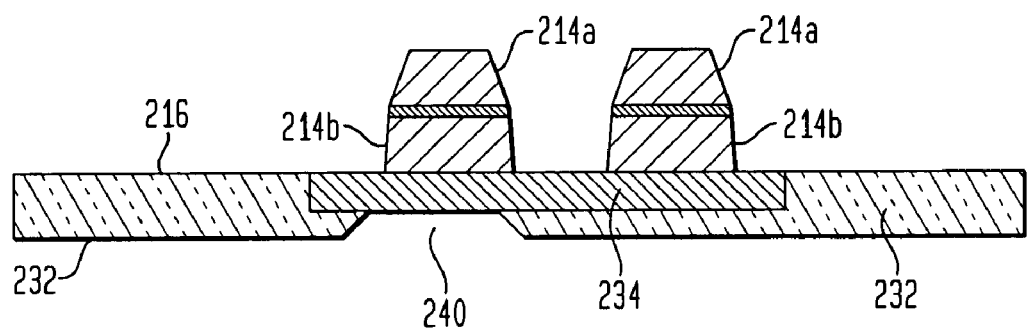

In another embodiment of the invention, an in-process unit 210 (FIG. 17) is formed by plating a trace 234 onto a tri-metal structure 224 having a first metal layer 220, a second metal layer 260, and an etch-stop layer 262 formed therebetween. A first dielectric layer 232 is then deposited over the trace 234 and the outside surface 218 of the second metal layer 260. This configuration allows posts 214 (FIG. 20) to be formed from both the first and second metal layers 232, 260. Each of the two metal layers may lend a different property to the post. For example, as shown in FIG. 20 the portion of the posts 214b formed out of the second metal layer 260 has a different shape than the portion of the post 214a formed from the first metal layer 232. Such a formation could also allow for different materials to be used to form the different portions of the posts 214 and would allow for other post configurations, such as, for example, those discussed in commonly-assigned, co-pending U.S. patent application Ser. No. 10/985,119, the disclosure of which is incorporated by reference herein. In forming these posts 214 according to the current embodiment, the second metal layer 260 is etched to form the first portion 214a of the post 214. The etch-stop layer 262 is then removed and the second portion of the post 214b is then formed, preferably by etching layer 226.

In a variant of this process, no etch-stop layer is provided between layers 226 and 260. In a further embodiment, a second dielectric layer can be deposited over inside surface 216 of the microelectric component 210 according to the same process discussed above.

As mentioned above, essentially any configuration of posts and traces can be made. As discussed in the aforementioned U.S. patent application Ser. No. 11/014,439, and as best appreciated with reference to FIG. 21, in a preferred embodiment of the present invention, the posts 314 and traces 334 formed using any of the processes discussed above can be arranged such that each trace has a support end 350 and a post end 352, with the posts 314 projecting from the support ends of the traces. Support elements 342 may be bonded to the support ends 350 so that each post 314 is connected to one support element 342. In such an embodiment, the support elements 342 may be solder balls. The bonds can be made, for example, by providing the support elements 342 on contacts 358 of a chip 356, positioning the microelectronic component 310 over the support elements and reflowing the solder balls by heating the assembly. In a variant of this process, the solder balls 342 can be provided on the support ends 350 of the traces 334. The process steps used to connect the support ends 338 of the traces 334 can be essentially the same as used in flip chip solder bonding of a chip to a circuit panel. The assembly of the chip and the connection component form a packaged chip. The posts 314 serve as terminals for electrically connecting the chip to a larger circuit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a microelectronic connection component comprising:
    treating an in-process unit including a first dielectric layer, traces exposed within openings of said first dielectric layer, and a first metal layer having a major surface in conductive communication continuously along lengths of said traces and contacting said first dielectric layer between said traces, said treating including etching the first metal layer to form posts projecting from said traces.

2. The method of claim 1 wherein said traces of said in-process unit include a plurality of traces spaced apart from one another, and wherein said step of etching the first metal layer includes etching the first metal layer to form posts projecting from at least two of said plurality of traces.

3. The method of claim 1, wherein said etching the metal layer exposes a face of the in-process unit, the method further including the step of depositing a second dielectric layer onto the posts and onto the exposed face of the in-process unit.

4. The method of claim 3 further including the step of removing a portion of the second dielectric layer such that the second dielectric layer is removed from the posts and at least some of the second dielectric layer remains on the face between the posts.

5. The method of claim 4 wherein the step of depositing a second dielectric layer results in portion of said second dielectric layer on the posts having a thickness that is less than a thickness of a portion of said second dielectric layer on the face.

6. The method of claim 5, wherein the step of removing a portion of the second dielectric layer includes a non-selective process.

7. The method of claim 6, wherein said second dielectric layer is composed of a photo-imageable material.

8. The method of claim 7 further comprising selectively exposing the photo-imageable material to light so that portions of the photo-imageable material on said posts are removable by washing and portions of the photo-imageable material on the face are substantially fixed, and wherein said non-selective process includes washing.

9. The method of claim 1, further comprising forming said in-process unit by steps including:
    a) providing a workpiece having a first metal layer, a second metal layer and an etch-stop layer disposed therebetween;
    b) etching said second metal layer and removing portions of said etch-stop layer to form said traces; and
    c) depositing said first dielectric layer on said traces and said first metal layer.

10. The method of claim 1, further comprising forming said in-process unit by steps including:
    a) providing the first metal layer;
    b) depositing traces on the first metal layer; and
    c) depositing said first dielectric layer on the traces and said first metal layer.

11. The method of claim 1, further comprising forming said in-process unit by steps including:
    a) providing a workpiece having a first metal layer, a second metal layer and an etch-stop layer therebetween;
    b) plating traces on said first metal layer; and
    c) depositing said first dielectric layer on said traces and said first metal layer.

12. The method of claim 1 further comprising attaching the connection component to a microelectronic element to form a packaged microelectronic element.

13. A method of forming a microelectronic connection component comprising:
   a) providing an in-process unit including a first metal layer having first and second surfaces and posts projecting from the first surface of the first metal layer;
   b) depositing a first dielectric layer on the posts and on the first surface of said first metal layer;
   c) removing a portion of the first dielectric layer such that the first dielectric layer is removed from the posts and at least some of the first dielectric layer remains on the first surface; and
   d) treating the in-process unit after step (c) by removing portions of the first metal layer to form traces such that said posts project from said traces.

14. The method of claim 13 further comprising the step of depositing a second dielectric layer on the traces.

15. The method of claim 14, wherein said step of depositing a second dielectric layer is performed such that the second dielectric layer includes at least one opening to provide access to a portion of at least one of said traces.

16. The method of claim 13, wherein the step of depositing a first dielectric layer is performed so that portions of the first dielectric layer on the posts have a thickness that is less than a thickness of portions of the first dielectric layer on the exposed surface.

17. The method of claim 16, wherein the step of removing a portion of the first dielectric layer includes a non-selective process.

18. The method of claim 17, wherein said first dielectric layer is composed of a photo-imageable material.

19. The method of claim 18 further comprising selectively exposing the photo-imageable material to light so that portions of the photo-imageable material on said posts are removable by washing and portions of the photo-imageable material on the first surface are substantially fixed, and wherein said non-selective process includes washing.

20. The method of claim 13, further comprising forming the in-process unit by steps including:
   a) providing a workpiece having a first metal layer, a second metal layer and an etch-stop layer disposed therebetween; and
   b) etching said second metal layer to form said posts and removing portions of said etch-stop layer between the posts.

21. The method of claim 13 further comprising attaching the connection component to a microelectronic element to form a packaged microelectronic element.

22. The method of claim 1, wherein at least some of said traces have a plurality of said posts extending therefrom.

23. The method of claim 13, wherein at least some of said traces have a plurality of said posts extending therefrom.

* * * * *

UNITED STATES PATENT AND TRADEMARK OFFICE
CERTIFICATE OF CORRECTION

PATENT NO.        : 7,632,708 B2
APPLICATION NO.   : 11/318822
DATED             : December 15, 2009
INVENTOR(S)       : Belgacem Haba and David B. Tuckerman It is certified that error appears in the above-identified patent and that said Letters Patent is hereby corrected as shown below:

Column 5, line 15 after "posts" delete ",".
Column 7, lines 55 through 56 "flip chip" should read --flip-chip--.
Column 7, line 57 "form" should read --forms--.
Column 8, line 27 after "in" insert --a--.

Signed and Sealed this
Fifteenth Day of March, 2011

David J. Kappos
*Director of the United States Patent and Trademark Office*